US010700178B2

(12) United States Patent
Glass et al.

(10) Patent No.: US 10,700,178 B2
(45) Date of Patent: Jun. 30, 2020

(54) CONTACT RESISTANCE REDUCTION EMPLOYING GERMANIUM OVERLAYER PRE-CONTACT METALIZATION

(71) Applicant: INTEL CORPORATION, Santa Clara, CA (US)

(72) Inventors: Glenn A. Glass, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/416,445

(22) Filed: May 20, 2019

(65) Prior Publication Data
US 2019/0341464 A1    Nov. 7, 2019

Related U.S. Application Data

(63) Continuation of application No. 15/339,308, filed on Oct. 31, 2016, now Pat. No. 10,297,670, which is a
(Continued)

(51) Int. Cl.
*H01L 29/45* (2006.01)
*H01L 29/66* (2006.01)
(Continued)

(52) U.S. Cl.
CPC ........ *H01L 29/45* (2013.01); *H01L 21/28518* (2013.01); *H01L 21/28525* (2013.01);
(Continued)

(58) Field of Classification Search
CPC .. H01L 29/45; H01L 21/28518; H01L 29/785
(Continued)

(56) References Cited

U.S. PATENT DOCUMENTS

| 5,296,386 A | 3/1994 | Aronowitz et al. |
| 5,296,387 A | 3/1994 | Aronowitz et al. |

(Continued)

FOREIGN PATENT DOCUMENTS

| CN | 101622690 | 1/2010 |
| JP | H-05-183160 | 7/1993 |

(Continued)

OTHER PUBLICATIONS

International Search Report and Written Opinion for International Patent Application No. PCT/US11/054198 dated Apr. 19, 2012, 13 pgs.
(Continued)

*Primary Examiner* — Fazli Erdem
(74) *Attorney, Agent, or Firm* — Schwabe, Williamson & Wyatt, P.C.

(57) ABSTRACT

Techniques are disclosed for forming transistor devices having reduced parasitic contact resistance relative to conventional devices. The techniques can be implemented, for example, using a standard contact stack such as a series of metals on, for example, silicon or silicon germanium (SiGe) source/drain regions. In accordance with one example such embodiment, an intermediate boron doped germanium layer is provided between the source/drain and contact metals to significantly reduce contact resistance. Numerous transistor configurations and suitable fabrication processes will be apparent in light of this disclosure, including both planar and non-planar transistor structures (e.g., FinFETs), as well as strained and unstrained channel structures. Graded buffering can be used to reduce misfit dislocation. The techniques are particularly well-suited for implementing p-type devices, but can be used for n-type devices if so desired.

20 Claims, 11 Drawing Sheets

Related U.S. Application Data continuation of application No. 14/673,143, filed on Mar. 30, 2015, now Pat. No. 9,484,432, which is a continuation of application No. 13/990,224, filed as application No. PCT/US2011/054198 on Sep. 30, 2011, now Pat. No. 8,994,104, which is a continuation-in-part of application No. 12/975,278, filed on Dec. 21, 2010, now Pat. No. 8,901,537.

(51) Int. Cl.
| | | |
|---|---|---|
| *H01L 29/78* | (2006.01) | |
| *H01L 29/08* | (2006.01) | |
| *H01L 29/165* | (2006.01) | |
| *H01L 21/285* | (2006.01) | |
| *H01L 21/768* | (2006.01) | |

(52) U.S. Cl.
CPC .. *H01L 21/76805* (2013.01); *H01L 21/76843* (2013.01); *H01L 21/76864* (2013.01); *H01L 21/76895* (2013.01); *H01L 29/0847* (2013.01); *H01L 29/165* (2013.01); *H01L 29/66545* (2013.01); *H01L 29/66636* (2013.01); *H01L 29/66795* (2013.01); *H01L 29/785* (2013.01); *H01L 29/7833* (2013.01); *H01L 29/7848* (2013.01); *H01L 29/7851* (2013.01)

(58) Field of Classification Search
USPC ............................................................ 257/190
See application file for complete search history.

(56) References Cited

U.S. PATENT DOCUMENTS

| | | | |
|---|---|---|---|
| 5,312,766 A | 5/1994 | Aronowitz et al. | |
| 6,607,948 B1 * | 8/2003 | Sugiyama | H01L 21/02381 438/151 |
| 7,221,006 B2 | 5/2007 | Orlowski et al. | |
| 7,667,227 B2 | 2/2010 | Shimamune et al. | |
| 7,683,362 B2 | 3/2010 | Ohta et al. | |
| 7,732,285 B2 | 6/2010 | Sell et al. | |
| 7,821,044 B2 | 10/2010 | Bohr et al. | |
| 7,880,228 B2 | 2/2011 | Yasutake | |
| 8,575,652 B2 | 11/2013 | Kamata | |
| 9,349,810 B2 * | 5/2016 | Glass | H01L 29/165 |
| 2003/0057416 A1 * | 3/2003 | Currie | H01L 29/105 257/19 |
| 2005/0130454 A1 | 6/2005 | Murthy et al. | |
| 2005/0184354 A1 | 8/2005 | Chu et al. | |
| 2006/0156080 A1 | 7/2006 | Tellkamp et al. | |
| 2006/0237746 A1 | 10/2006 | Orlowski et al. | |
| 2006/0255330 A1 | 11/2006 | Chen et al. | |
| 2007/0187767 A1 * | 8/2007 | Yasutake | H01L 21/28518 257/368 |
| 2007/0238236 A1 | 10/2007 | Cook, Jr. et al. | |
| 2007/0275548 A1 | 11/2007 | Lavoie et al. | |
| 2008/0135878 A1 | 6/2008 | Kim et al. | |
| 2008/0179752 A1 | 7/2008 | Yamauchi et al. | |
| 2008/0197412 A1 | 8/2008 | Zhang et al. | |
| 2008/0242037 A1 * | 10/2008 | Sell | H01L 21/30608 438/299 |
| 2009/0206370 A1 * | 8/2009 | Chu | H01L 29/45 257/197 |
| 2009/0224369 A1 | 9/2009 | Gamble et al. | |
| 2009/0302348 A1 * | 12/2009 | Adam | H01L 21/26513 257/190 |
| 2010/0148217 A1 | 6/2010 | Simonelli | |
| 2011/0062498 A1 | 3/2011 | Yang et al. | |
| 2011/0068407 A1 | 3/2011 | Yeh et al. | |
| 2012/0007051 A1 | 1/2012 | Bangsaruntip et al. | |
| 2012/0037998 A1 | 2/2012 | Bedell et al. | |
| 2013/0240989 A1 | 9/2013 | Glass et al. | |
| 2014/0070377 A1 | 3/2014 | Yu et al. | |

FOREIGN PATENT DOCUMENTS

| | | |
|---|---|---|
| JP | H-07-169958 | 7/1995 |
| JP | 2006-186240 | 7/2006 |
| JP | 2007-036205 | 2/2007 |
| JP | 2007-165665 | 6/2007 |
| JP | 2007-214481 | 8/2007 |
| JP | 2007-318132 | 12/2007 |
| JP | 2012-510720 | 5/2012 |
| WO | WO 2010-068530 | 6/2010 |

OTHER PUBLICATIONS

International Preliminary Report Patentability for International Patent Application No. PCT/US11/054198 dated Jul. 4, 2013, 9 pgs.
Office Action for Korean Patent Application No. 2013-7016072 dated May 23, 2014, 4 pgs., with English translation.
Notice of Allowance for Korean Patent Application No. 2013-7016072 dated Nov. 13, 2014, 3 pgs., with English translation.
Office Action for Japanese Patent Application No. 2013-546134 dated Aug. 26, 2014, 4 pgs. of English translation and 3 pgs. with no translation.
Notice of Allowance for Japanese Patent Application No. 2013-546134 dated Feb. 10, 2015, 3 pgs., no translation.
Extended European Search Report for European Patent Application No. 11852027.9 dated Aug. 11, 2014, 14 pgs.
"Metal/Semi conductor Ohmic Contacts Technology or Gate Length Series Resistance (ohms)", 1997, XP055127433, Retrieved from the Internet: URL:http://web.stanford.edu/class/ee311/N0 TES/Ohmic_Contacts.pdf [retrieved on Jul. 8, 2014] the whole document.
Office Action for European Patent Application No. 11852027.9 dated Oct. 12, 2015, 4 pgs.
First Office Action for Chinese Patent Application No. 201180062116.2 dated May 5, 2015, 6 pgs., no translation.
Second Office Action for Chinese Patent Application No. 201180062116.2 dated Oct. 20, 2015, 3 pgs., no translation.
Notice of Allowance for Chinese Patent Application No. 201180062116.2 dated Feb. 26, 2016, 4 pgs., with English translation.
First Office Action for Chinese Patent Application No. 201610313170.4 dated May 4, 2018, 6 pgs., no translation.
Second Office Action for Chinese Patent Application No. 201610313170.4 dated Dec. 3, 2018, 5 pgs., no translation.
Third Office Action for Chinese Patent Application No. 201610313170.4 dated Apr. 10, 2019, 4 pgs., no translation.
Office Action for Chinese Patent Application No. 201610313170.4 dated Nov. 29, 2019, 6 pgs.
Office Action for European Patent Application No. 11852027.9 dated Dec. 12, 2019, 2 pgs.
Notice of Allowance for European Patent Application No. 19188924.5 dated Oct. 23, 2019, 2 pgs.
Stanton P. Ashburn et al: Formation of C54 Titanium Germanosilicide Using Rapid Thermal Processing and Application to Raised, Ultrashallow Junctions, Materials Research Society Symposium Proceedings,vol. 320, Jan. 1, 1993, pp. 311-316, XP055631293.
Office Action for Chinese Patent Application No. 201610313170.4 dated Mar. 24, 2020, 12 pgs.
Office Action for Chinese Patent Application No. 201610313170.4 dated Apr. 24, 2020, 3 pgs.

* cited by examiner

CONTACT RESISTANCE REDUCTION EMPLOYING GERMANIUM OVERLAYER PRE-CONTACT METALIZATION

RELATED APPLICATIONS

This patent application is a continuation of U.S. application Ser. No. 15/339,308, filed Oct. 31, 2016, which is a continuation of U.S. application Ser. No. 14/673,143, filed Mar. 30, 2015, which is a continuation of Ser. No. 13/990,224, filed May 29, 2013, now U.S. Pat. No. 8,994,104, which is a U.S. National Phase application under 35 U.S.C. § 371 of International Application No. PCT/US2011/054198, filed Sep. 30, 2011, which is a continuation-in-part of U.S. application Ser. No. 12/975,278 filed Dec. 21, 2010, now U.S. Pat. No. 8,901,537, each of which are incorporated herein by reference in their entireties.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to minimize the parasitic resistance associated with contacts otherwise known as external resistance $R_{ext}$. Decreased $R_{ext}$ enables higher current from an equal transistor design.

Figure 1A:
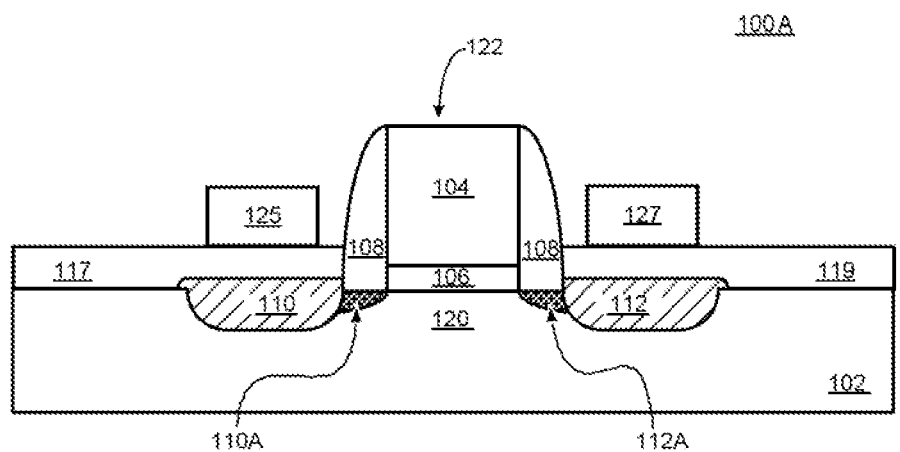
FIG. 1A illustrates a MOS device configured with a boron doped germanium layer between the source/drain layer and contact metals, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming transistor devices having reduced parasitic contact resistance relative to conventional devices. The techniques can be implemented, for example, using a standard contact stack such as a series of metals on silicon or silicon germanium (SiGe) source/drain regions. In accordance with one example such embodiment, an intermediate boron doped germanium layer is provided between the source/drain and contact metals to significantly reduce contact resistance. Numerous transistor configurations and suitable fabrication processes will be apparent in light of this disclosure, including both planar and non-planar transistor structures (e.g., FinFETs), as well as strained and unstrained channel structures. The techniques are particularly well-suited for implementing p-type devices, but can be used for n-type devices if so desired.

General Overview

As previously explained, increased drive current in the transistors can be achieved by reducing device resistance. Contact resistance is one component of a device's overall resistance. A standard transistor contact stack typically includes, for example, a silicon or SiGe source/drain layer, a nickel silicide layer, a titanium nitride adhesion layer, and a tungsten contact/pad. In such configurations, the contact resistance is effectively limited by the silicon or SiGe valence band alignment to the pinning level in the metal. Typically, using industry standard silicides such as nickel (or other suitable silicides, such as titanium, cobalt, or platinum), this results in a band misalignment of about 0.5 eV. Thus, and in accordance with an example embodiment of the present invention, an intermediate boron doped germanium layer is provided between the source/drain and contact metals to significantly reduce the band misalignment value and contact resistance.

In one specific example embodiment, contacts configured with the intermediate boron doped germanium layer exhibit a reduction in the band misalignment value to less than 0.2 eV and a corresponding reduction in contact resistance of about 3× (relative to a conventional contact stack similarly configured, but without the intermediate boron doped germanium layer between the source/drain regions and contact metal). A transmission electron microscopy (TEM) cross section or secondary ion mass spectrometry (SIMS) profile can be used to show the germanium concentration throughout the vertical stack of the film structure, as profiles of epitaxial alloys of silicon and SiGe can readily be distinguished from germanium concentration profiles.

Thus, transistor structures configured in accordance with embodiments of the present invention provide an improvement over conventional structures with respect to lower contact resistance. Some such embodiments effectively marry superior contact properties of germanium with superior semiconductor transistor properties of Si and SiGe to provide next generation low resistance contacts.

Numerous transistor configurations and suitable fabrication processes will be apparent in light of this disclosure, including both planar and non-planar transistor structures (e.g., such as double-gate and trigate transistor structures), as well as strained and unstrained channel structures. Any number of such structural features and material systems can be used in conjunction with a germanium overlayer as described herein. The transistor structure may include p-type source/drain regions, n-type source/drain regions, or both n-type and p-type source/drain regions. In some example embodiments, the transistor structure includes dopant-implanted source/drain regions or epitaxial (or poly) replacement source/drain regions of silicon, SiGe alloys, or nominally pure germanium films (e.g., such as those with less than 10% silicon) in a MOS structure. In any such implementations, an overlayer or cap of boron doped germanium can be formed directly over the source/drain regions, in accordance with an embodiment of the present invention. A contact metal (or series of metals) can then be deposited and a subsequent reaction (annealing) can be carried out to form metal germanide source and drain contacts. As will be appreciated, the contact may be implemented as a stack including one or more of a silicide layer, an adhesion layer, and/or a metal pad layer. The boron doped germanium overlayer can be formed directly over other parts of the transistor structure as well, such as the poly gate and/or grounding tap regions, if so desired.

As is known, a MOS transistor may include source and drain tip regions that are designed to decrease the overall resistance of the transistor while improving short channel effects (SCE). Conventionally, these tip regions are portions of the substrate where a dopant such as boron or carbon is implanted using an implant and diffusion technique. The source tip region is formed in the area between the source region and the channel region. Likewise, the drain tip region is formed in the area between the drain region and the channel region. Some embodiments of the present invention are configured with such conventionally formed tip regions. In other example embodiments, fabrication techniques are employed to extend self-aligned epitaxial tip (SET) transistors to achieve very near to the theoretical limit of uniaxial strain. This can be accomplished, for instance, by selective epitaxial deposition in the source and drain regions as well as their corresponding tip regions to form a bilayer construction of boron doped silicon or SiGe (for the source/drain regions) capped with an overlayer of a boron doped germanium layer in the source/drain and respective tip regions. The germanium and boron concentrations can vary, but in some example embodiments, the germanium concentration is in the range of 20 atomic % to 100 atomic %, and the boron concentration is in the range of 1E20 cm$^{-3}$ to 2E21 cm$^{-3}$ (e.g., germanium concentration in excess of 50 atomic % and boron concentration in excess of 2E20 cm$^{-3}$). Note that the boron doped germanium layer may be provided in the tip regions, but in other embodiments is just provided over the source/drain regions (and not in the tip regions).

In still other example embodiments, an optional thin buffer with graded germanium concentration and/or boron concentration can be used as an interfacial layer between the underlying substrate with the source/drain layer (e.g., silicon or SiGe). Likewise, a thin buffer with graded germanium concentration and/or boron concentration can be used as an interfacial layer between the source/drain layer and the boron doped germanium cap. In still other embodiments, the boron doped germanium overlayer or source/drain layer themselves can have a graded germanium and/or boron concentration in a similar fashion as to the optional buffers. In any such case, since boron diffusion is suppressed in germanium (the higher the concentration, the greater the relative suppression), a high concentration of boron can be doped in the germanium, which in turn results in lower parasitic resistance and without degrading tip abruptness. In addition, the contact resistance is reduced from lowering of Schottky-barrier height.

Architecture and Methodology

FIG. 1A illustrates a MOS device 100A formed on a substrate 102 and configured with a boron doped germanium layer between the source/drain layer and contact metals, in accordance with an embodiment of the present invention. In particular, boron doped germanium layer 117 is provided between the source layer 110 and contact metals 125, and boron doped germanium layer 119 is provided between the drain layer 112 and contact metals 127. The source region 110 and the drain region 112 can be formed using any number of conventional techniques. In this example embodiment, for instance, the source region 110 and the drain region 112 are formed by etching the substrate and then epitaxially depositing a silicon or silicon germanium material (e.g., with a germanium concentration in the range of, for instance, 10 to 70 atomic %).

A gate stack 122 is formed over a channel region 120 of the transistor 100A. As can further be seen, the gate stack 122 includes a gate dielectric layer 106 and a gate electrode 104, and spacers 108 are formed adjacent to the gate stack 122. In some example cases, and depending on the technology node, the spacers 108 create a distance of about 10 to 20 nanometers (nm) between the edges of the gate dielectric layer 106 and the edges of each of the source and drain regions 110/112. It is within this space that a source tip region 110A and a drain tip region 112A can be formed. In this example embodiment, the tip regions 110A/112A are formed via a typical implantation-diffusion based process, and overlap the spacers 108 and may also overlap or underdiffuse the gate dielectric layer 106 by a distance of, for instance, less than 10 nm. In forming the implantation-diffusion based tip regions 110A/112A, a dopant such as boron or carbon is implanted into the source region 110 and the drain region 112. The transistor 100A is then annealed to cause the dopant to diffuse towards the channel region 120. Angled ion implantation techniques may also be used to further implant dopants into those areas between the gate dielectric layer 106 and the source/drain regions 110/112. Such implantation-diffusion-based tip formation processes generally do not induce a strain on the channel region.

In any case, and as will be appreciated in light of this disclosure, whether a transistor structure has a strained or unstrained channel, or source-drain tip regions or no source-drain tip regions, is not particularly relevant to various embodiments of the present invention, and such embodiments are not intended to be limited to any particular such structural features. Rather, any number of transistor structures and types can benefit from employing a boron doped germanium overlayer as described herein. The techniques provided herein are compatible, for instance, with conventional dopant implanted silicon, raised source/drain, strained SiGe (or other suitable materials), and any deposited epitaxial tip (sometimes referred to as source-drain extensions) that extend below the gate electrode dielectric or are spaced away from the vertical line defined by the gate electrode dielectric.

The germanium overlayer 117/119 is generally provided after formation of the source/drain regions 110/112 and prior to formation of the contacts 125/127. The thickness of this overlayer 117/119 can vary from one embodiment to the next, but in one example embodiment is in the range of 50 to 250 Angstroms (Å). The boron concentration of overlayer 117/119 can also vary, but in one example embodiment is in the range of 1E20 cm$^{-3}$ to 2E21 cm$^{-3}$ (e.g., in excess of 2E20 cm$^{-3}$). The overlayer 117/119 can be selectively deposited over the source/drain 110/112 regions (and/or other regions as desired, such as the poly gate or grounding tap regions). Any number of suitable deposition techniques can be used to provide the overlayer 117/119 (e.g., chemical vapor deposition, molecular beam epitaxy, etc). In accordance with one example embodiment, the contact metals 125 and 127 each comprise a stack a nickel silicide layer, a titanium nitride adhesion layer, and a tungsten contact/pad, and although any number of contact metal configurations can be used as will be appreciated in light of this disclosure. Standard deposition techniques can be used in providing the contact metals 125/127.

Figure 1B:
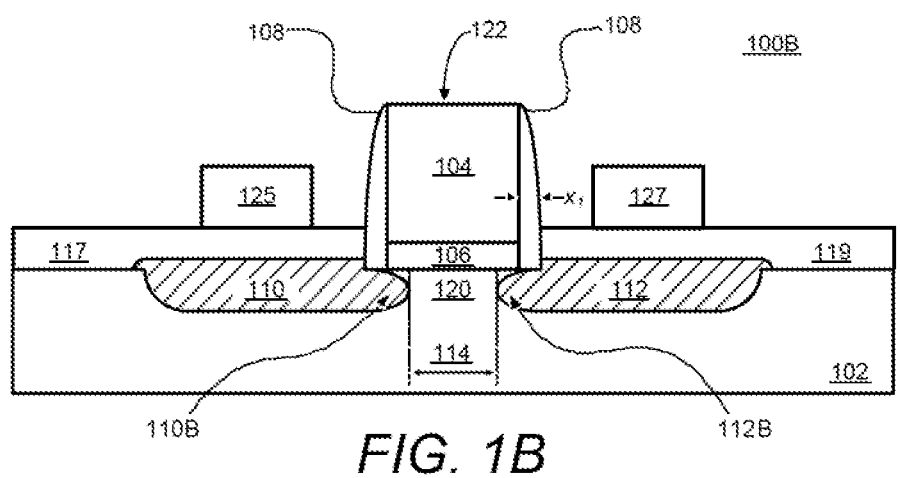
FIG. 1B illustrates a MOS device configured with a boron doped germanium layer between the source/drain layer and contact metals, in accordance with another embodiment of the present invention.

FIG. 1B illustrates an example MOS device 100B formed on a substrate 102 and configured with a boron doped germanium layer 117/119 between the source/drain layer 110/112 and contact metals 125/127, in accordance with another embodiment of the present invention. This example configuration includes source and drain epitaxial tips (generally referred to herein as epi-tips). In more detail, the MOS transistor 100B uses an undercut etch to allow the source region 110 and the drain region 112 to extend below the spacers 108, and in some cases, below the gate dielectric layer 106. The portions of the source/drain regions 110/112 that extend below the spacers 108 (and possibly the gate dielectric layer 106) are generally referred to as the source epi-tip 110B and the drain epi-tip 112B, respectively. The source and drain epi-tips 110B/112B replace the implantation/diffusion based tip regions 110A/112A described with regard to FIG. 1A. In accordance with one embodiment, the source/drain regions 110/112 and the source/drain epi-tips 110B/112B can be formed, for example, by etching the substrate 102, which includes undercutting the spacers 108 (and possibly the gate dielectric layer 106), and then using selective epitaxial deposition to provide, for instance, an in situ doped silicon, germanium, or SiGe to fill the source/drain regions 110/112 and the source/drain epi-tips 110B/112B, as shown in FIG. 1B. Note the epitaxial fill may be raised relative to the surface of substrate 102, as further shown in FIG. 1B, although non-raised configurations can be used as well. The germanium overlayer 117/119 and the contact metals 125/127 can be implemented, for instance, as previously described with respect to FIG. 1A.

Figure 1C:
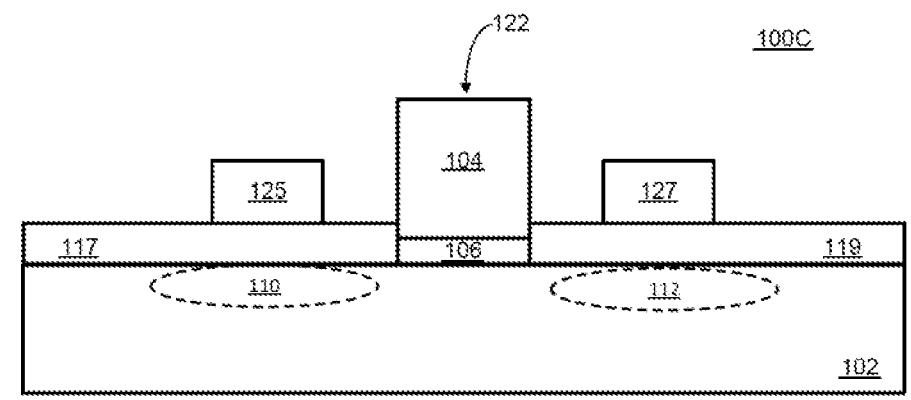
FIG. 1C illustrates a MOS device configured with a boron doped germanium layer between the source/drain layer and contact metals, in accordance with another embodiment of the present invention.

FIG. 1C illustrates a MOS device 100C formed on a substrate 102 and configured with boron doped germanium layers 117/119 between the respective source/drain layers 110/112 and contact metals 125/127, in accordance with another embodiment of the present invention. The source region 110 and the drain region 112 in this example embodiment are formed by implanting dopants such as boron into the substrate. The gate stack 122 is formed over a channel region 120 of the transistor 100C and is this example case does not include sidewalls 108. Nor does this example transistor structure include an undercut or tip regions like the embodiments shown in FIGS. 1A and 1B. The germanium overlayer 117/119 and the contact metals 125/127 can be implemented, for instance, as previously described with respect to FIG. 1A.

Numerous other variations and features can be implemented for transistor structures configured in accordance with an embodiment of the present invention. For example, a graded buffer may be used in one or more locations of the structure. For instance, the substrate 102 can be a silicon substrate, or a silicon film of a silicon on insulator (SOI) substrate, or a multi-layered substrate comprising silicon, silicon germanium, germanium, and/or III-V compound semiconductors. Thus, and by way of example, in an embodiment having a silicon or silicon germanium substrate 102 and an in situ boron doped SiGe fill in the source/drain regions 110/112 and the source/drain epi-tips 110B/112B, a buffer can be provided between the underlying substrate 102 and the source/drain material. In one such embodiment, the buffer can be a graded boron doped (or intrinsic) silicon germanium layer with the germanium concentration graded from a base level compatible with the underlying substrate up to 100 atomic % (or near 100 atomic %, such as in excess of 90 atomic % or 95 atomic % or 98 atomic %). The boron concentration within this buffer can be either fixed (e.g., at a high level) or graded, for instance, from a base concentration at or otherwise compatible with the underlying substrate up to a desired high concentration (e.g., in excess of 2E20 cm$^{-3}$). Note that 'compatibility' as used herein does not necessitate an overlap in concentration levels (for instance, the germanium concentration of underlying substrate can be 0 to 20 atomic % and initial germanium concentration of the buffer can be 30 to 40 atomic %). In addition, as used herein, the term 'fixed' with respect to a concentration level is intended to indicate a relatively constant concentration level (e.g., the lowest concentration level in the layer is within 10% of the highest concentration level within that layer). In a more general sense, a fixed concentration level is intended to indicate the lack of an intentionally graded concentration level. The thickness of the buffer can vary depending on factors such as the range of concentrations being buffered, but in some embodiments is in the range of 30 to 120 Å, such as 50 to 100 Å (e.g., 60 Å or 65 Å). As will be further appreciated in light of this disclosure, such a graded buffer beneficially lowers the Schottky-barrier height.

Alternatively, rather than using a thin buffer between the substrate 102 and the source/drain regions 110/112 and the source/drain epi-tips 110B/112B, the source/drain material itself can be graded in a similar fashion. For example, and in accordance with one example embodiment, boron doped SiGe source/drain regions 110/112 and the source/drain epi-tips 110B/112B can be configured with a germanium concentration graded from a base level concentration compatible with the underlying substrate (e.g., in the range of 30 to 70 atomic %) up to 100 atomic %. In some such embodiments, the boron concentration within this boron doped germanium layer can range, for example, from a base concentration at or otherwise compatible with the underlying substrate up to a desired high concentration (e.g., in excess of 2E20 cm$^{-3}$).

In other embodiments, a buffer can be provided between the source/drain material and the boron doped germanium overlayer 117/119. In one such embodiment, the source/drain material is a boron doped SiGe layer having a fixed concentration of germanium (e.g., in the range of 30 to 70 atomic %) and the buffer can be a thin SiGe layer (e.g., 30 to 120 Å, such as 50 to 100 Å) having a germanium concentration graded from a base level concentration compatible with the underlying boron doped SiGe layer up to 100 atomic % (or near 100 atomic %, such as in excess of 90 atomic % or 95 atomic % or 98 atomic %). In some cases, the boron concentration within this buffer can be fixed at a desired high level or can range, for example, from a base concentration at or otherwise compatible with the underlying SiGe layer up to the desired high concentration (e.g., in excess of 1E20 cm$^{-3}$, 2E20 cm$^{-3}$, or 3E20 cm$^{-3}$). Alternatively, rather than using a buffer between the source/drain material and the boron doped germanium overlayer 117/119, the overlayer 117/119 itself can be graded in a similar fashion. For example, and in accordance with one example embodiment, the boron doped overlayer 117/119 can be configured with a germanium concentration graded from a base level concentration compatible with the underlying substrate and/or source/drain regions (e.g., in the range of 30 to 70 atomic %) up to 100 atomic % (or near 100 atomic %). The boron concentration within this overlayer 117/119 layer can be fixed at a desired high level or can range, for example, from a base concentration at or otherwise compatible with the underlying substrate and/or source/drain regions up to the desired high level (e.g., in excess of 2E20 cm$^{-3}$).

Thus, a low contact resistance architecture for numerous transistor devices is provided. The devices may be formed in part using any number of conventional processes such as, for example, by gate oxide, poly gate electrode, thin spacer, and an isotropic undercut etch in the source/drain regions (or an ammonia etch to form faceted fin recess in monocrystalline substrate, or other suitable etch to form fin recess). In accordance with some embodiments, selective epitaxial deposition can be used to provide in situ doped silicon or alternatively, a fully strained silicon germanium layer to form source/drain regions with or without tips. Optional buffers may be used as previously explained. Any suitable high-k replacement metal gate (RMG) process flow can also be used, where a high-k dielectric replaces the conventional gate oxide. Silicidation with, for example, nickel, nickel-platinum, or titanium with or without germanium pre-amorphization implants can be used to form a low resistance germanide. The techniques provided herein can be applied, for example, to benefit any technology nodes (e.g., 90 nm, 65 nm, 45 nm, 32 nm, 22 nm, 14 nm, and 10 nm transistors, and lower), and the claimed invention is not intended to be limited to any particular such nodes or range of device geometries. Other advantages will be apparent in light of this disclosure.

Figure 2:
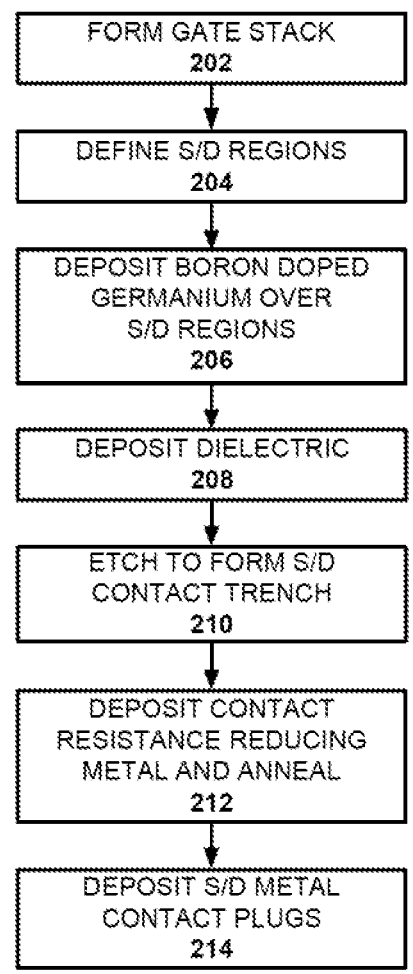
FIG. 2 is a method for forming a transistor structure with low contact resistance in accordance with an embodiment of the present invention.

FIG. 2 is a method for forming a transistor structure with low contact resistance in accordance with an embodiment of the present invention. FIGS. 3A through 3I illustrate example structures that are formed as the method is carried out, and in accordance with some embodiments.

Figure 3A:
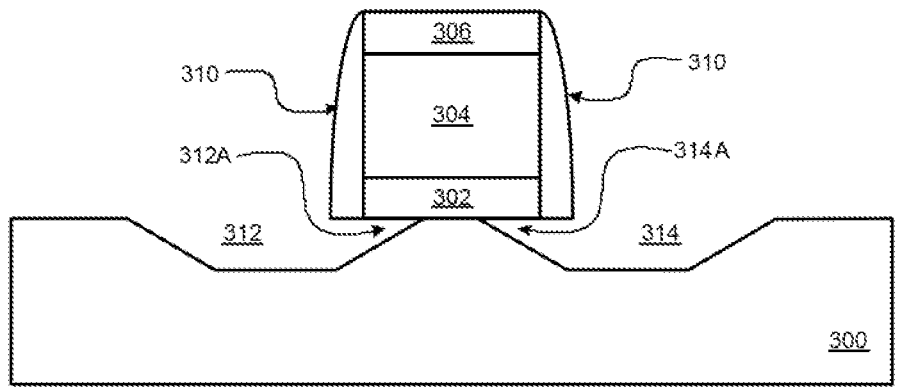
FIGS. 3A to 3I illustrate structures that are formed when carrying out the method of FIG. 2, in accordance with various embodiment of the present invention.

As can be seen, the method begins with forming 202 a gate stack on a semiconductor substrate upon which a MOS device, such as a PMOS transistor, may be formed. The semiconductor substrate may be implemented, for example, with a bulk silicon or a silicon-on-insulator configuration. In other implementations, the semiconductor substrate may be formed using alternate materials, which may or may not be combined with silicon, such as germanium, silicon germanium, indium antimonide, lead telluride, indium arsenide, indium phosphide, gallium arsenide, or gallium antimonide. In a more general sense, any material that may serve as a foundation upon which a semiconductor device may be built can be used in accordance with embodiments of the present invention. The gate stack can be formed as conventionally done or using any suitable custom techniques. In some embodiments of the present invention, the gate stack may be formed by depositing and then patterning a gate dielectric layer and a gate electrode layer. For instance, in one example case, a gate dielectric layer may be blanket deposited onto the semiconductor substrate using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric layer may be thermally grown. The gate dielectric material may be formed, for example, from materials such as silicon dioxide or high-k dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some specific example embodiments, the high-k gate dielectric layer may be between around 5 Å to around 200 Å thick (e.g., 20 Å to 50 Å). In general, the thickness of the gate dielectric layer should be sufficient to electrically isolate the gate electrode from the neighboring source and drain contacts. In further embodiments, additional processing may be performed on the high-k gate dielectric layer, such as an annealing process to improve the quality of the high-k material. Next, a gate electrode material may be deposited on the gate dielectric layer using similar deposition techniques such as ALD, CVD, or PVD. In some such specific embodiments, the gate electrode material is polysilicon or a metal layer, although other suitable gate electrode materials can be used as well. The gate electrode material, which is may be a sacrificial material that is later removed for a replacement metal gate (RMG) process, has a thickness in the range of 50 Å to 500 Å (e.g., 100 Å), in some example embodiments. A conventional patterning process may then be carried out to etch away portions of the gate electrode layer and the gate dielectric layer to form the gate stack, as shown in FIG. 3A. As can be seen, FIG. 3A illustrates a substrate 300 upon which a gate stack is formed. In this example embodiment, the gate stack includes a gate dielectric layer 302 (which may be high-k gate dielectric material) and a sacrificial gate electrode 304. In one specific example case, the gate stack includes a silicon dioxide gate dielectric layer 302 and a polysilicon gate electrode 304. The gate stack may also include a gate hard mask layer 306 that provides certain benefits or uses during processing, such as protecting the gate electrode 304 from subsequent ion implantation processes. The hard mask layer 306 may be formed using typical hard mask materials, such as such as silicon dioxide, silicon nitride, and/or other conventional dielectric materials. FIG. 3A further illustrates spacers 310 formed on either side of the stack. The spacers 310 may be formed, for example, using conventional materials such as silicon oxide, silicon nitride, or other suitable spacer materials. The width of the spacers 310 may generally be chosen based on design requirements for the transistor being formed. In accordance with some embodiments, however, the width of the spacers 310 is not subject to design constraints imposed by the formation of the source and drain epi-tips, given sufficiently high boron doped germanium content in the source/drain tip regions, as described herein (boron won't diffuse into channel).

Figure 3B:
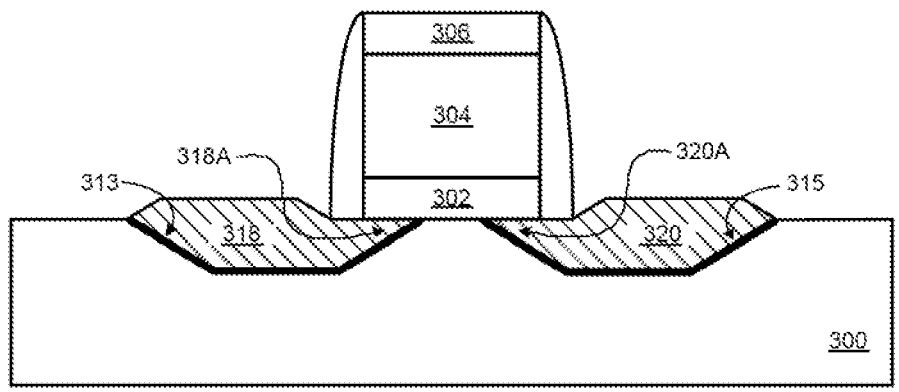

With further reference to FIG. 2, after the gate stack is formed, the method continues with defining 204 the source/drain regions of the transistor structure. As previously explained, the source/drain regions can be implemented with any number of suitable processes and configurations. For example, the source/drain regions may be implanted, etched and epi filled, raised, silicon or SiGe alloy, p-type and/or n-type, and have a planar or fin shaped diffusion region. In the example embodiment shown in FIG. 3A, substrate 300 has been etched to provide cavities 312/314 as well as respective tip areas 312A/314A which undercuts the gate dielectric 302. FIG. 3B illustrates the substrate 300 after cavities 312/314 and tip areas 312A/314A have been filled to provide the source/drain regions 318/320 and tip regions 318A/320A. In accordance with some example embodiments, the source and drain region cavities 312/314 along with their respective tip areas 312A/314A are filled with in situ doped silicon or SiGe, thereby forming source region 318 (along with epi-tip 318A) and drain region 320 (along with drain epi-tip 320A). Any number of source/drain layer configurations can be used here, with respect to materials (e.g., silicon, SiGe, III-V materials), dopant (e.g., boron in excess of 2E21 $cm^{-3}$, or other suitable dopant/concentration), and dimension (e.g., thickness of source/drain layer may range, for instance, from 50 to 500 nm so as to provide a flush or raised source/drain region).

As previously explained, some such embodiments may include with a thin buffer between the source/drain layer and the substrate or the source/drain and boron doped germanium overlayer. For instance, and as can further be seen in the example embodiment shown in FIG. 3B, a source buffer 313 and a drain buffer 315 are deposited prior to depositing the source/drain materials. In some embodiments, the buffers 313 and 315 can be a graded boron doped silicon germanium layer with the germanium composition graded from a base level concentration compatible with the underlying substrate 300 material up to 100 atomic % (or near to 100 atomic % as previously described). The boron concentration can be appropriately graded as well. Numerous buffer schemes will be apparent in light of this disclosure.

Figure 3C:
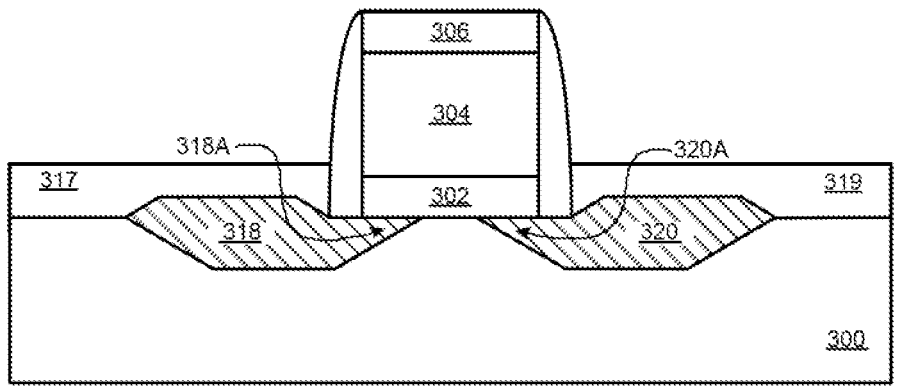

With further reference to FIG. 2, after the source/drain regions are defined, the method continues with depositing 206 boron doped germanium on the source/drain regions of the transistor structure. FIG. 3C shows the boron doped germanium layer 317/319. In some example embodiments, the boron doped germanium layer 317/319, which may be epitaxially deposited in one or more layers, has a germanium concentration in excess of 90 atomic %, although other suitable concentration levels can be used as will be appreciated in light of this disclosure (e.g., in excess of 91 atomic %, or 92 atomic %, . . . , or 98 atomic %, or 99 atomic %, or truly pure germanium). As previously explained, this germanium concentration may be fixed or graded so as to increase from a base level (near substrate 300) to a high level (e.g., in excess of 90 atomic %). The boron concentration in some such embodiments can be in excess of 1E20 $cm^{-3}$, such as higher than 2E20 $cm^{-3}$ or 2E21 $cm^{-3}$, and may also be graded so as to increase from a base level near substrate 300 to a high level (e.g., in excess of 1E20 $cm^{-3}$ or 2E20 $cm^{-3}$ or 3E20 $cm^{-3}$, . . . , 2E21 $cm^{-3}$). In embodiments where the germanium concentration of the underlying source/drain regions 318/320 is fixed or otherwise relatively low, a graded buffer may be used to better interface source/drain regions 318/320 with the boron doped germanium layer 317/319, as previously explained. The thickness of the boron doped germanium cap 317/319 may have a thickness in the range, for example, of 50 to 250 Å, in accordance with some specific example embodiments, although alternative embodiments may have other layer thicknesses, as will be apparent in light of this disclosure.

In some embodiments, a CVD process or other suitable deposition technique may be used for the depositing 206 or otherwise forming the boron doped germanium layer 317/319. For example, the depositing 206 may be carried out in a CVD, or rapid thermal CVD (RT-CVD), or low pressure CVD (LP-CVD), or ultra-high vacuum CVD (UHV-CVD), or gas source molecular beam epitaxy (GS-MBE) tool using germanium and boron containing precursors such as germane ($GeH_4$) or digermane ($Ge_2H_6$) and diborane ($B_2H_6$) or boron difluoride ($BF_2$). In some such embodiments, there may be a carrier gas such as, for instance, hydrogen, nitrogen, or a noble gas (e.g., precursor is diluted at 1-5% concentration of carrier gas). There may also be an etchant gas such as, for example, halogen-based gas such as hydrogen chloride (HCl), chlorine (Cl), or, hydrogen bromide (HBr). The basic deposition of germanium and also boron doped germanium is possible over a wide range of conditions using deposition temperature in the range, for example, of 300° C. to 800° C. (e.g., 300-500° C.) and reactor pressure, for instance, in the range 1 Torr to 760 Torr. Germanium is naturally selective in that it deposits on silicon or silicon-germanium alloy, and does not deposit on other materials such as silicon dioxide and silicon nitride. Since this natural selectivity is not entirely perfect, a small flow of etchant can be used to increase the selectivity of the deposition, as previously noted. Each of the carrier and etchants can have a flow in the range of 10 and 300 SCCM (typically, no more than 100 SCCM of flow is required, but some embodiments may require higher flow rates). In one specific example embodiment, the deposition 206 is carried out using $GeH_4$ that is diluted in hydrogen at a 1% concentration and at a flow rate that ranges between 100 and 1000 SCCM. For an in situ doping of boron, diluted $B_2H_6$ may be used (e.g., the $B_2H_6$ may be diluted in $H_2$ at 3% concentration and at a flow rate that ranges between 100 and 600 SCCM. In some such specific example cases, an etching agent of HCl or $Cl_2$ is added at a flow rate that ranges, for example, between 10 and 100 SCCM, to increase the selectivity of the deposition.

As will be appreciated in light of this disclosure, the selectivity at which the boron doped germanium layer 317/319 is deposited can vary as desired. In some cases, for instance, the boron doped germanium layer 317/319 is deposited only on the source/drain regions 318/320 or a portion of the source/drain regions 318/320 (rather than across the entire structure). Any number of masking/patterning techniques can be used to selectively deposit layer 317/319. Moreover, other embodiments may benefit from layer 317/319 covering, for example, poly gate regions or grounding tap regions. As will further be appreciated in light of this disclosure, the combination of high germanium concentration (e.g., in excess of 90 atomic % and up to pure germanium) and high boron concentration (e.g., in excess of 2E20 $cm^{-3}$) can be used to realize significantly lower contact resistance in the source and drain regions (and other areas where low contact resistance is desirable, such as ground tap regions), in accordance with some example embodiments. Further, and as previously explained, since boron diffusion is sufficiently suppressed by pure germanium, no adverse SCE degradation is realized with subsequent thermal anneals despite any high boron concentration proximate the channel (if applicable). Barrier height lowering is also enabled from the higher concentration of germanium at the contact surface. In some example embodiments, a germanium concentration in excess of 95 atomic % and up to pure germanium (100 atomic %) can be used to achieve such benefits.

Figure 3D:
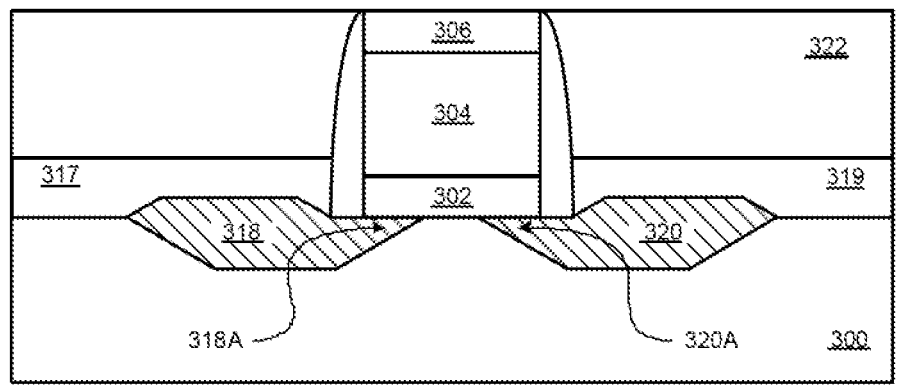

With further reference to FIG. 2, after the boron doped germanium layer 317/319 is provided, the method continues with depositing 208 a dielectric over layer 317/319. FIG. 3D shows dielectric 322 as being flush with the hard mask 306 of the gate stack, but it need not be. The dielectric can be configured in a number of ways. In some embodiments, dielectric 322 is implemented with silicon dioxide ($SiO_2$) or other low-k dielectric materials. In other embodiments, dielectric 322 is implemented with a silicon nitride (SiN) liner followed by one or more layers of $SiO_2$, or any combination of nitride, oxide, oxynitride, carbide, oxycarbide, or other suitable dielectric materials). The dielectric 322, which may be referred to as an interlayer dielectric (ILD), may be planarized as commonly done. Other example dielectric materials include, for instance, carbon doped oxide (CDO), organic polymers such as perfluorocyclobutane or polytetrafluoroethylene, fluorosilicate glass (FSG), and organosilicates such as silsesquioxane, siloxane, or organosilicate glass. In some example configurations, the ILD layer may include pores or other voids to further reduce its dielectric constant.

Figure 3E:
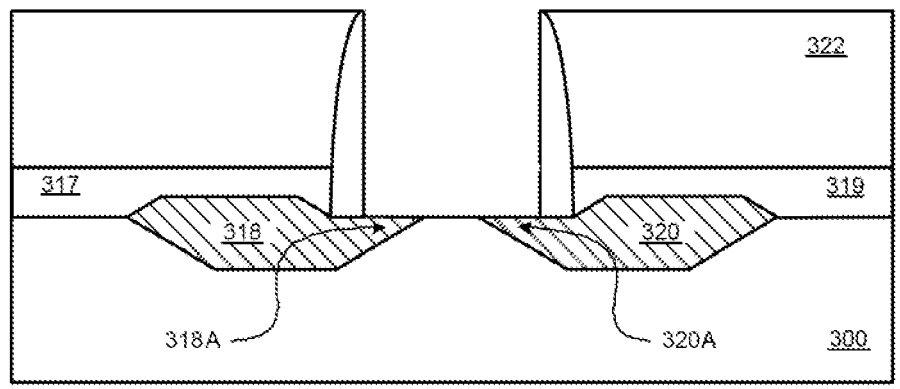
Figure 3F:
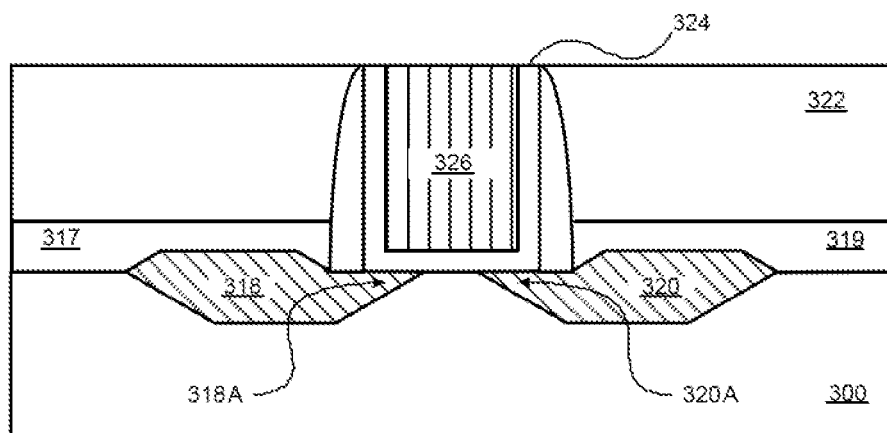

Next, in some embodiments of the present invention where a replacement metal gate (RMG) process is used and as best shown in FIG. 3E, the method may further include removing the gate stack (including the high-k gate dielectric layer 302, the sacrificial gate electrode 304, and the hard mask layer 306) using an etching process as conventionally done. In alternate implementations, only the sacrificial gate 304 and hard mask layer 306 are removed. FIG. 3E illustrates the trench opening that is formed when the gate stack is etched away, in accordance with one such embodiment. If the gate dielectric layer is removed, the method may continue with depositing a new gate dielectric layer into the trench opening (designated as 324 in FIG. 3F). Any suitable high-k dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material. As further shown in FIG. 3F, the method may further continue with depositing the metal gate electrode layer 326 into the trench and over the gate dielectric layer 324. Conventional metal deposition processes may be used to form the metal gate electrode layer, such as CVD, ALD, PVD, electroless plating, or electroplating. The metal gate electrode layer may include, for example, a P-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited in the gate trench followed by a suitable metal gate electrode fill metal such as aluminum or silver.

Figure 3G:
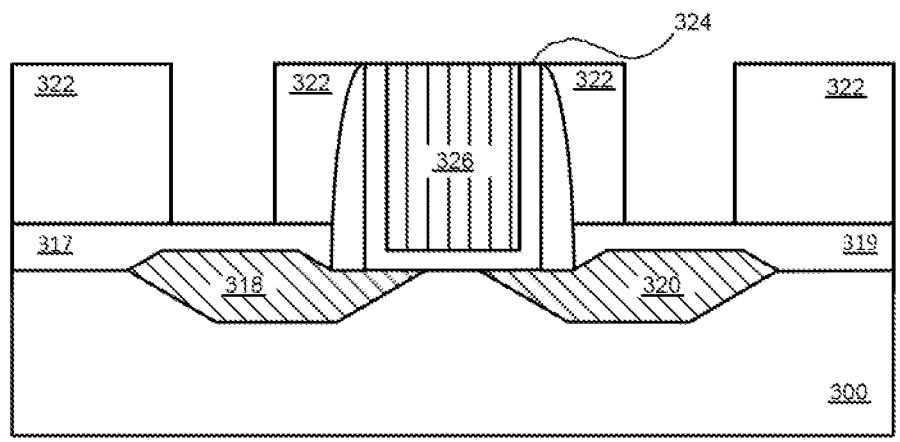
Figure 3H:
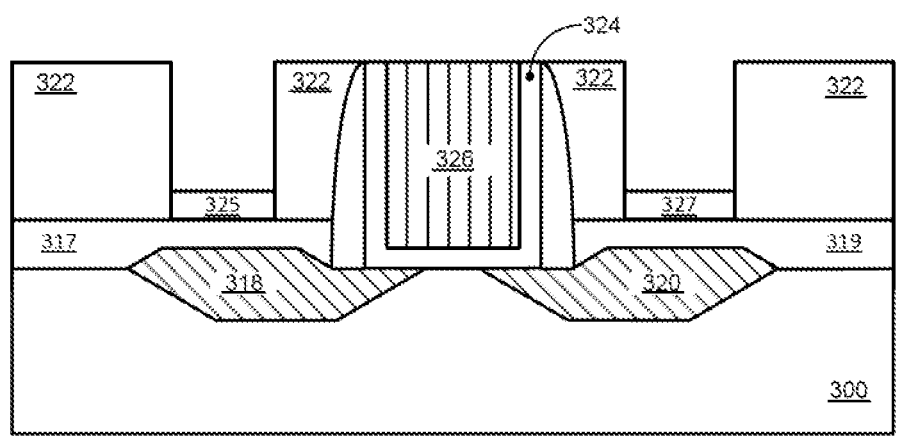
Figure 3I:
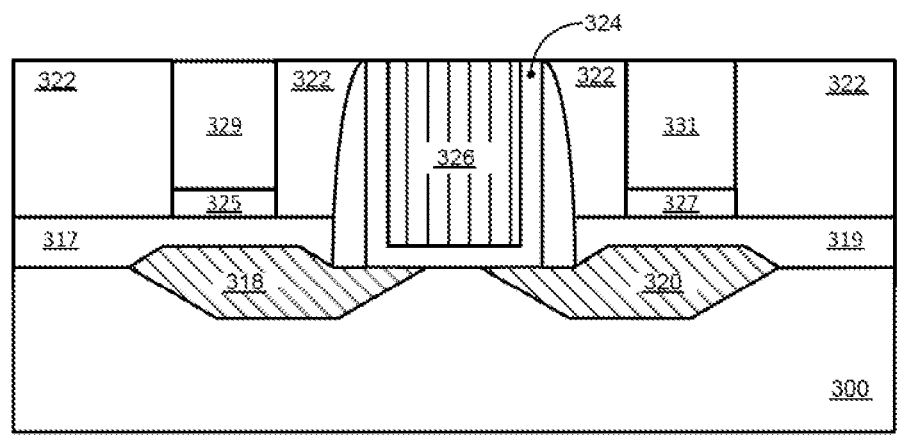

With further reference to FIG. 2, after dielectric layer 322 is provided over layer 317/319 (and any desired RMG process), the method continues with etching 210 to form the source/drain contact trenches. Any suitable dry and/or wet etch processes can be used. FIG. 3G shows the source/drain contact trenches after etching is complete, in accordance with one example embodiment. The method then continues with depositing 212 contact resistance reducing metal and annealing to form silicide/germanide, and then depositing 214 the source/drain contact plugs. FIG. 3H shows the contact metals 325/327, which in some embodiments includes the silicide/germanide, although other embodiments may include additional layers (e.g., adhesion layer). FIG. 3I shows the contact plug metal 329/331, which in some embodiments includes aluminum, although any suitably conductive contact metal or alloy can be used for the contact plug 329/331, such as silver, nickel-platinum or nickel-aluminum or other alloys of nickel and aluminum, or titanium, using conventional deposition processes. The germanide/metalization 212 of the source and drain contacts can be carried out, for instance, by silicidation with nickel, aluminum, nickel-platinum or nickel-aluminum or other alloys of nickel and aluminum, or titanium with or without germanium pre-amorphization implants to form a low resistance germanide. The boron doped germanium layer 317/319 allows for metal-germanide formation (e.g., nickel-germanium). The germanide allows for significantly lower Schottky-barrier height and improved contact resistance (including $R_{ext}$) over that in conventional metal-silicide systems. For instance, conventional transistors typically use a source/drain SiGe epi process, with germanium concentration in the range of 30-40 atomic %. Such conventional systems exhibit $R_{ext}$ values of about 140 Ohm*um, limited by epi/silicide interfacial resistance, which is high and may impede future gate pitch scaling. Some embodiments of the present invention allow for a significant improvement in $R_{ext}$ in PMOS devices (e.g., about a 2× improvement or better, such as a $R_{ext}$ of about 70 Ohm*um), which can better support PMOS device scaling. Thus, transistors having a source/drain configured with boron doped germanium cap 317/319 in accordance with an embodiment of the present, with a boron concentration in excess of 1E20 $cm^{-3}$ and a germanium concentration in excess of 90 atomic % and up to or otherwise near pure germanium (100 atomic %) at the interface between the source/drain regions 318/320 and the contact metals 325/327, can exhibit $R_{ext}$ values of less than 100 Ohm*um, and in some cases less than 90 Ohm*um, and in some cases less than 80 Ohm*um, and in some cases less than 75 Ohm*um, or lower.

Figure 4:
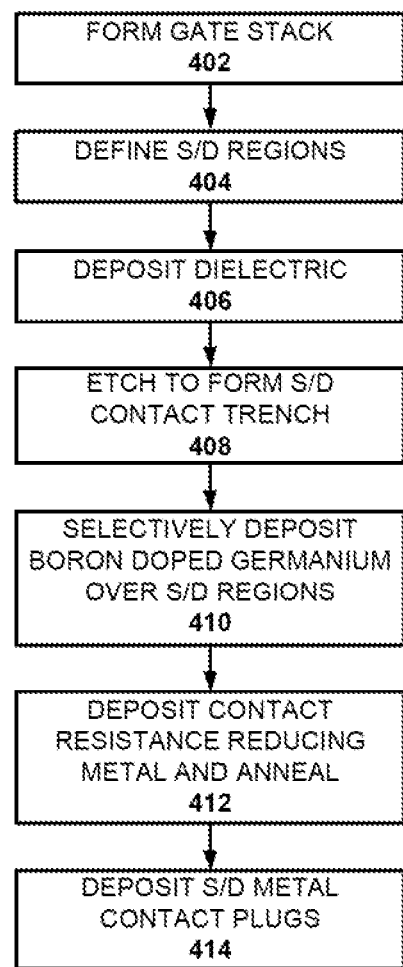
FIG. 4 is a method for forming a transistor structure with low contact resistance in accordance with another embodiment of the present invention.
Figure 5A:
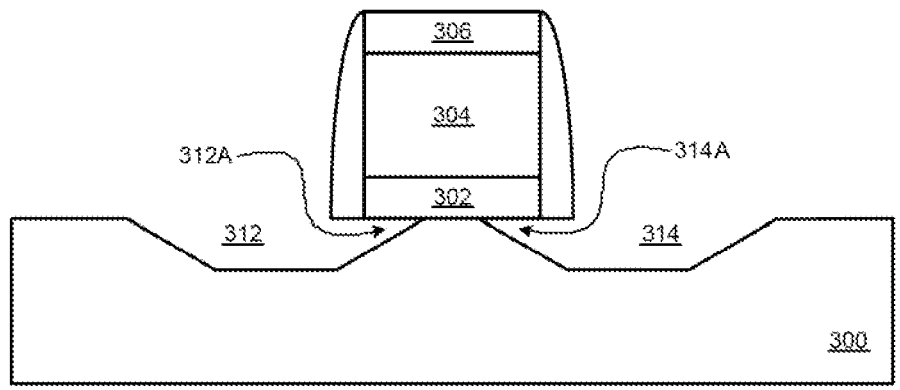
FIGS. 5A to 5F illustrate structures that are formed when carrying out the method of FIG. 4, in accordance with various embodiment of the present invention.
Figure 5B:
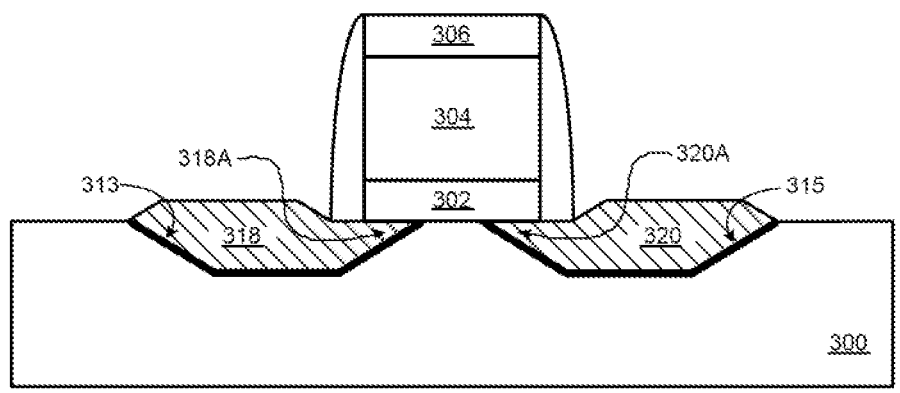
Figure 5C:
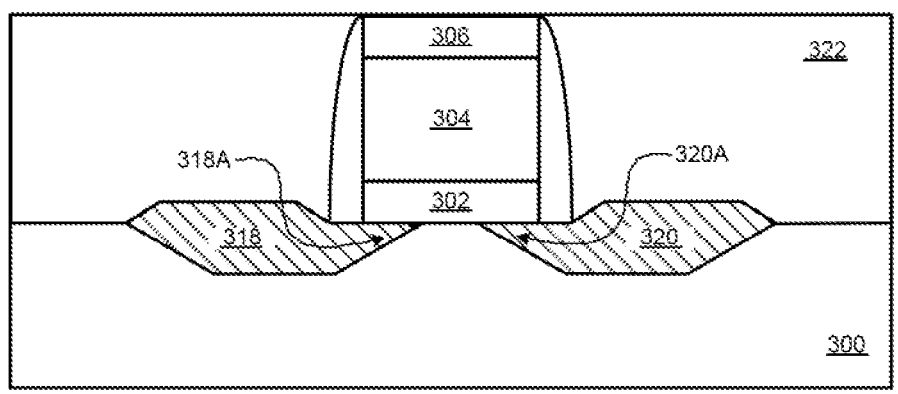
Figure 5D:
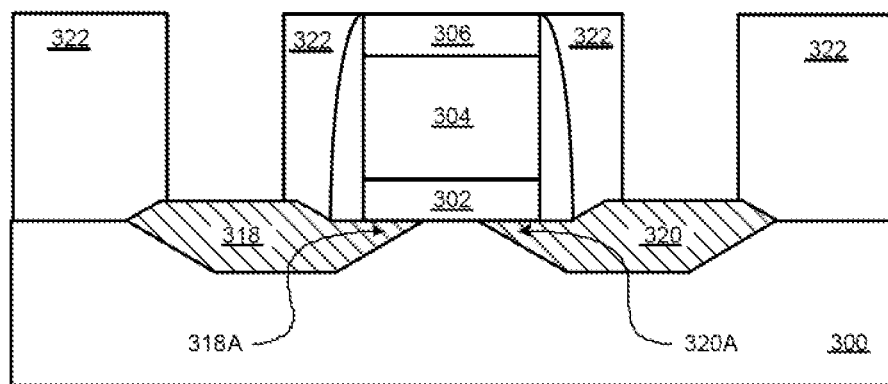
Figure 5E:
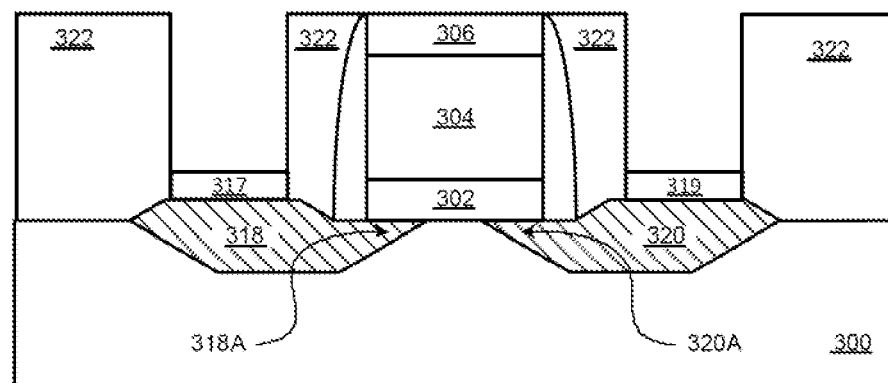
Figure 5F:
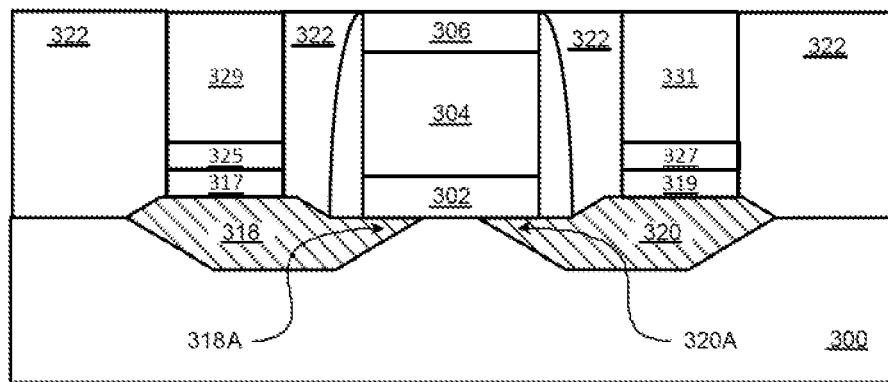

FIG. 4 is a method for forming a transistor structure with low contact resistance in accordance with another embodiment of the present invention. FIGS. 5A through 5F illustrate example structures that are formed as the method is carried out, and in accordance with some embodiments. In general, this method is similar to the method described with reference to FIGS. 2 and 3A-H, except that the deposition of the boron doped germanium layer 317/319 on the source/drain regions is carried out after the dielectric 322 is deposited and etched to form the contact trench. Thus, the method includes depositing 406 the dielectric 322 directly over the source/drain regions 318/320, and then continues with etching 408 to form the source/drain contact trench and then selectively depositing 410 the boron doped germanium layer 317/319 into the trench (and directly onto the source/drain regions 318/320), as best shown in FIGS. 5C through 5E. Depositing 410 can be carried out using any suitable deposition process, such as selective epitaxy. Once layer 317/319 is provided, the contact metals 325/327 can be provided on top of the layer 317/319, as shown in FIG. 5F. This alternate methodology provides the same benefit of improved contact resistance, but is more selective in where the boron doped germanium is deposited. Other such selective deposition processes will be apparent in light of this disclosure, using any suitable combination of masking/patterning and selective deposition techniques.

As will be further appreciated, the previous relevant discussion with respect to similar parts of the method is equally applicable here. In particular, forming 402 a gate stack and defining 404 the source/drain regions of the transistor structure can be carried as previously discussed with reference to the forming 202 and defining 204 previously discussed with reference to FIG. 2. Likewise, depositing 412 contact resistance reducing metal and annealing to form silicide/germanide, and then depositing 414 the source/drain contact plugs can be carried as previously discussed with reference to the forming 212 and defining 214 previously discussed with reference to FIG. 2.

FinFET Configuration

As is known, FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin).

Figure 6:
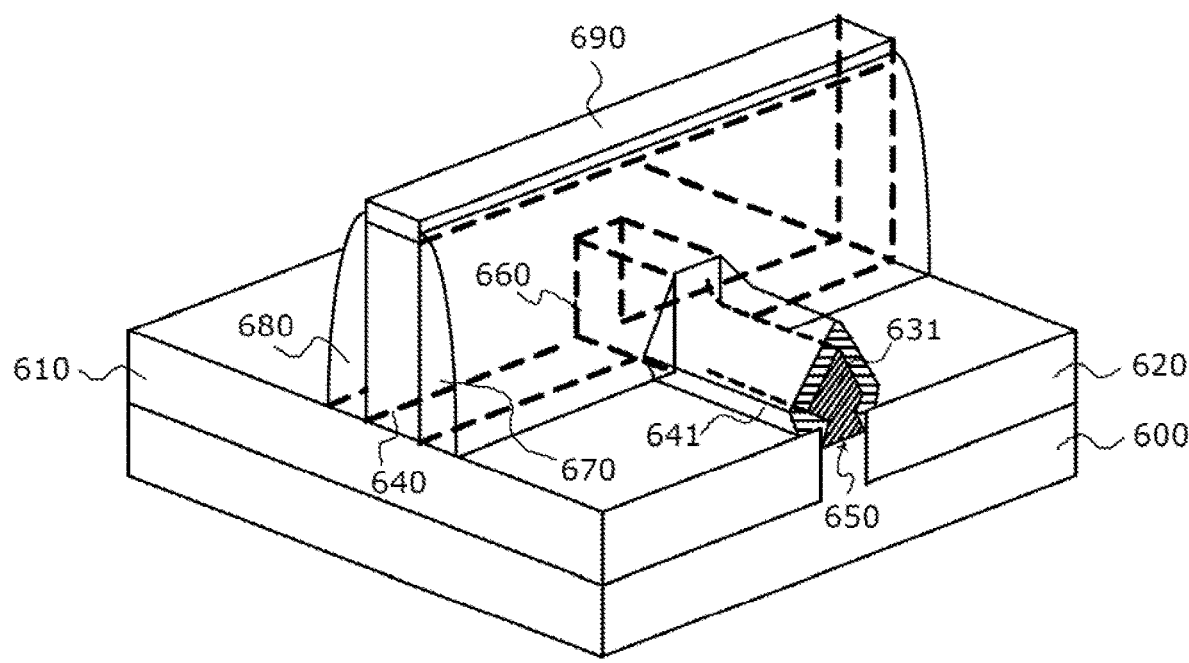
FIG. 6 shows a perspective view of a FinFET transistor architecture, configured in accordance with one embodiment of the present invention.

FIG. 6 shows a perspective view of an example tri-gate architecture, configured in accordance with one embodiment of the present invention. As can be seen, the tri-gate device includes a substrate 600 having a semiconductor body or fin 660 (represented by dashed lines) extending from the substrate 600 through isolation regions 610, 620. A gate electrode 640 is formed over 3 surfaces of the fin 660 to form 3 gates. A hard mask 690 is formed on top of the gate electrode 640. Gate spacers 670, 680 are formed at opposite sidewalls of the gate electrode 640.

A source region comprises the epitaxial region 631 formed on a recessed source interface 650 and on one fin 660 sidewall, and a drain region comprises the epitaxial region 631 formed on a recessed source interface 650 and on the opposing fin 660 sidewall (not shown). A cap layer 641 is deposited over the epitaxial regions 631. Note that the boron cap layer 641 may be provided in the recessed (tip) regions, but in other embodiments is just provided over the source/drain regions (and not in the recessed regions). In one embodiment, the isolation regions 610, 620 are shallow trench isolation (STI) regions formed using conventional techniques, such as etching the substrate 600 to form trenches, and then depositing oxide material onto the trenches to form the STI regions. The isolation regions 610, 620 can be made from any suitable dielectric/insulative material, such as $SiO_2$. The previous discussion with respect to the substrate 102 is equally applicable here (e.g., substrate 600 may be a silicon substrate, or SOI substrate, or a multi-layered substrate).

As will be appreciated in light of this disclosure, conventional processes and forming techniques can be used to fabricate the FinFET transistor structure. However, and in accordance with one example embodiment of the present invention, the bilayer structure of the epitaxial region 631 and cap layer 641 can be implemented, for instance, using an in situ doped silicon or SiGe (for 631) capped with a boron doped germanium (for 641), with an optional germanium and/or boron graded buffer between the two bilayers. As previously explained, such a buffer may be used to transition from a base level germanium/boron concentration compatible with the epitaxial region 631 to the boron doped germanium cap 641. Alternatively, germanium and/or boron concentration grading can be implemented directly in the epitaxial region 631 and/or the cap 641, rather than in an intervening graded buffer arrangement. As will further be appreciated, note that an alternative to the tri-gate configuration is a double-gate architecture, which includes a dielectric/isolation layer on top of the fin 660.

Figure 7:
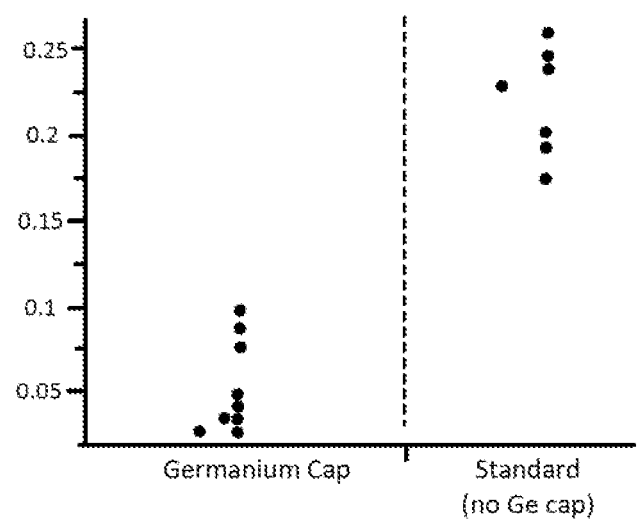
FIG. 7 shows a plot of a split lot showing contact resistance for transistor structures configured with in accordance with embodiments of the present invention and standard transistor structures configured with no cap.

FIG. 7 shows a plot of a split lot showing contact resistance for transistor structures configured with in accordance with embodiments of the present invention and standard transistor structures configured with no cap. The transistor structures associated with the high resistance numbers in excess of 0.18 are all implemented with standard SiGe alloy raised PMOS source/drain regions with contact metal deposited directly thereon. The transistor structures associated with the resistance numbers of 0.107 and lower are all similarly implemented but with the addition a boron doped germanium cap between the source/drain regions and contact metal, in accordance with various embodiments of the present invention. Table 1 shows the raw data quantiles resulting from testing of the example structures with and without a boron doped germanium cap as described herein.

TABLE 1

| Ge Cap | Min | 10% | 25% | Median | 75% | 90% | Max |
|---|---|---|---|---|---|---|---|
| Yes | 0.032 | 0.032 | 0.033 | 0.040 | 0.078 | 0.105 | 0.107 |
| No | 0.183 | 0.183 | 0.192 | 0.239 | 0.250 | 0.265 | 0.265 |

As can be seen, this example lot actually shows an improvement (reduction) in contact resistance of about a three to six times (3× to 6×) over conventional transistor structures. The units are Ohms per arbitrary area.

Other improvements enabled by using a boron doped germanium cap in accordance with an embodiment of the present invention will be apparent in light of this disclosure. In particular, the resulting germanide materials and Schottky barrier height improvement enables more than a 2× $R_{ext}$ improvement over that in conventional SiGe source/drain PMOS devices, in accordance with some example embodiments of the present invention. As is known, the Schottky barrier height is the barrier for electrical conduction across a semiconductor-metal junction. The magnitude of the Schottky barrier height reflects a mismatch in the energy position of the metal's Fermi level and the majority carrier band edge of the semiconductor across the semiconductor-metal interface. For a p-type semiconductor-metal interface, the Schottky barrier height is the difference between the metal Fermi level and the valence band maximum of the semiconductor.

Example System

Figure 8:
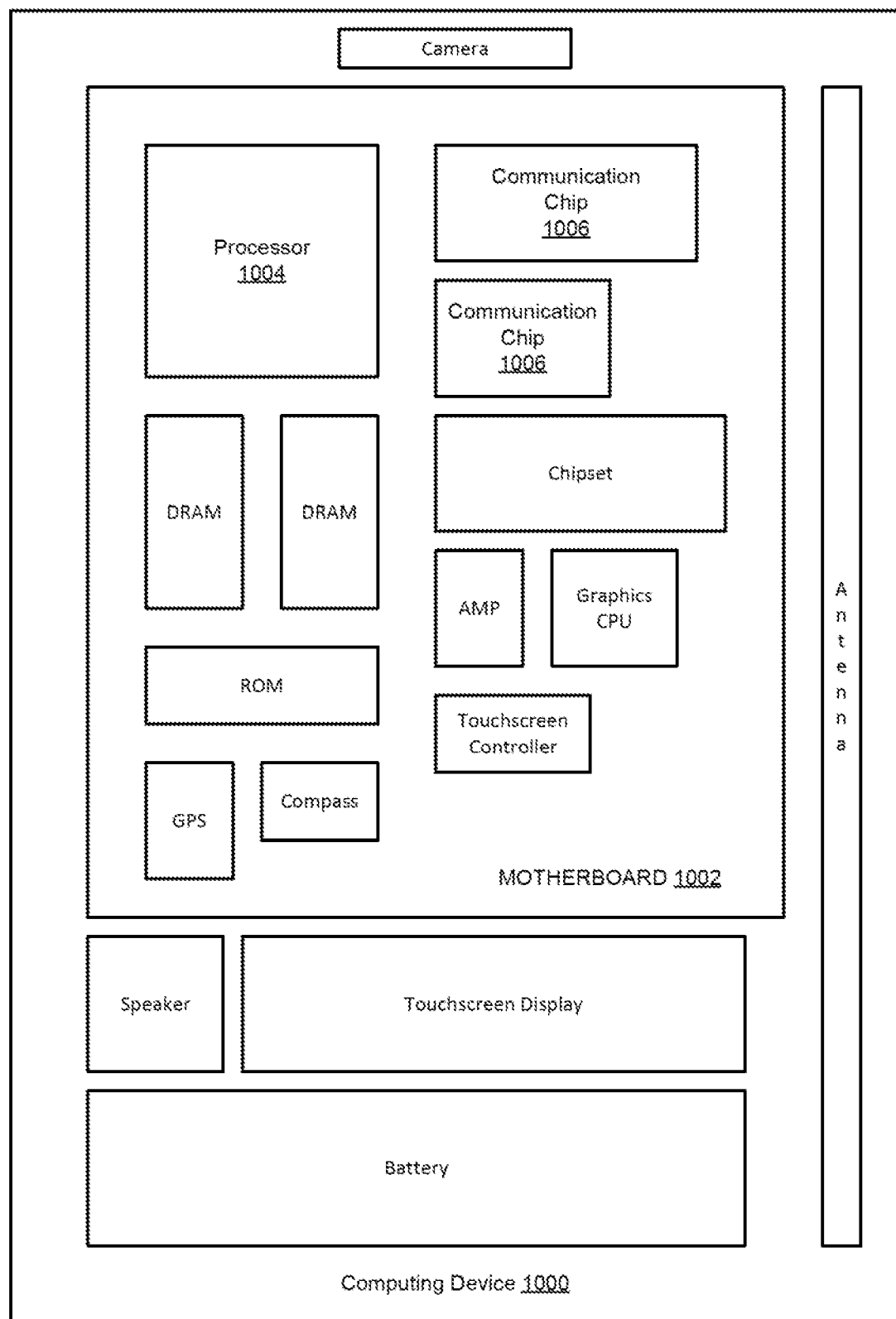
FIG. 8 illustrates a computing system implemented with one or more transistor structures in accordance with an example embodiment of the present invention.

FIG. 8 illustrates a computing device 1000 configured in accordance with one embodiment of the invention. As can be seen, the computing device 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of device 1000, etc. Depending on its applications, computing device 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 1000 may include one or more transistor structures as described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some embodiments of the present invention, the integrated circuit die of the processor includes an onboard non-volatile memory or cache, and/or is otherwise communicatively coupled to off-chip memory that is implemented with one or more transistor structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the device 1000 may be any other electronic device that processes data or employs transistors.

Numerous embodiments will be apparent in light of this disclosure, and features described herein can be combined in any number of configurations. One example embodiment of the present invention provides a transistor device. The device includes a substrate having a channel region, and a gate electrode above the channel region. A gate dielectric layer is provided between the gate electrode and the channel region, and source and drain regions are provided in the substrate and adjacent to the channel region. The device further includes a boron doped germanium layer on at least a portion of the source and drain regions. This boron doped germanium layer comprises a germanium concentration in excess of 90 atomic % and a boron concentration in excess of $1E20$ $cm^{-3}$. The device further includes metal-germanide source and drain contacts on the boron doped germanium layer. In one such example, the device is one of a planar or FinFET transistor. In another example case, the device comprises a PMOS transistor. In another example case, the device further includes an interlayer dielectric. In another example case, the device further includes a graded buffer between the substrate and the source and drain regions and/or a graded buffer between the source and drain regions and the boron doped germanium layer. In one such case, the graded buffer between the source and drain regions and the boron doped germanium layer has a germanium concentration that is graded from a base level concentration compatible with the source and drain regions to a high concentration in excess of 95 atomic %. In one such specific example case, the high concentration reflects pure germanium. In another example case, the graded buffer between the source and drain regions and the boron doped germanium layer has a boron concentration that is graded from a base level concentration compatible with the source and drain regions to a high concentration in excess of $1E20$ $cm^{-3}$. In another example case, the boron doped germanium layer has a graded concentration of at least one of germanium and boron. In another example case, the source and drain regions comprise silicon germanium having a germanium concentration that is graded from a base level concentration compatible with the substrate to a high concentration in excess of 50 atomic %, and the boron doped germanium layer has a germanium concentration in excess of 95 atomic %. In another example case, the source and drain regions comprise boron doped silicon germanium having a boron concentration that is graded from a base level concentration compatible with the substrate to a high concentration in excess of $1E20$ $cm^{-3}$. In another example case, the source and drain regions comprise silicon or silicon germanium, and the device further comprises a buffer between the source and drain regions and the boron doped germanium layer, the buffer having a germanium concentration that is graded from a base level concentration compatible with the source and drain regions to a high concentration in excess of 50 atomic %, and a boron concentration that is graded from a base level concentration compatible with the source and drain regions to a high concentration in excess of $1E20$ $cm^{-3}$. In another example case, the boron doped germanium layer comprises a germanium concentration in excess of 98 atomic %, and a boron concentration in excess of $2E20$ $cm^{-3}$. Another embodiment provides an electronic device that includes a printed circuit board having one or more integrated circuits, wherein at least one of the one or more integrated circuits comprises one or more transistor devices as variously defined in this paragraph. In one such case, the one or more integrated circuits includes at least one of a communication chip and/or a processor, and at least one of the communication chip and/or processor comprises the one or more transistor devices. In another such case, the device is a computing device (e.g., mobile telephone or smartphone, laptop, tablet computer, etc).

Another embodiment of the present invention provides a transistor device. In this example case, the device includes a substrate having a channel region, and a gate electrode above the channel region, wherein a gate dielectric layer is provided between the gate electrode and the channel region and spacers are provided on sides of the gate electrode. The device further includes source and drain regions in the substrate and adjacent to the channel region, each of the source and drain regions including a tip region that extends under the gate dielectric layer and/or a corresponding one of the spacers. The device further includes a boron doped germanium layer on at least a portion of the source and drain regions, and comprising a germanium concentration in excess of 95 atomic % and a boron concentration in excess of 2E20 cm$^{-3}$. The device further includes metal-germanide source and drain contacts on the boron doped germanium layer. The device is one of a planar or FinFET transistor. In one such example case, the device further includes a buffer between the source and drain regions and the boron doped germanium layer, wherein the buffer has a germanium concentration that is graded from a base level concentration compatible with the source and drain regions to a high concentration in excess of 95 atomic %, and a boron concentration that is graded from a base level concentration compatible with the source and drain regions to a high concentration in excess of 2E20 cm$^{-3}$. In another example case, the boron doped germanium layer has a graded concentration of at least one of germanium and boron. In another example case, the source and drain regions comprise silicon germanium having a germanium concentration that is graded from a base level concentration compatible with the substrate to a high concentration in excess of 50 atomic %, and the boron doped germanium layer has a germanium concentration in excess of 98 atomic %. In another example case, the source and drain regions have a boron concentration that is graded from a base level concentration compatible with the substrate to a high concentration in excess of 2E20 cm$^{-3}$. In another example case, the source and drain regions comprise silicon germanium having a fixed germanium concentration, and the device further comprises a buffer between the source and drain regions and the boron doped germanium layer, the buffer having a germanium concentration that is graded from a base level concentration compatible with the source and drain regions to a high concentration in excess of 50 atomic %, and a boron concentration that is graded from a base level concentration compatible with the source and drain regions to a high concentration in excess of 2E20 cm$^{-3}$, the buffer having a thickness of less than 100 Angstroms. Another embodiment provides a computing device (e.g., desktop or portable computer, etc) that includes a printed circuit board having a communication chip and/or a processor, wherein at least one of the communication chip and/or processor comprises one or more transistor devices as variously defined in this paragraph.

Another embodiment of the present invention provides a method for forming a transistor device. The method includes providing a substrate having a channel region, and providing a gate electrode above the channel region, wherein a gate dielectric layer is provided between the gate electrode and the channel region. The method continues with providing source and drain regions in the substrate and adjacent to the channel region, and providing a boron doped germanium layer on at least a portion of the source and drain regions. The boron doped germanium layer comprises a germanium concentration in excess of 90 atomic % and a boron concentration in excess of 1E20 cm$^{-3}$. The method continues with providing metal-germanide source and drain contacts on the boron doped germanium layer. In some example such cases, the method further includes providing a graded buffer between the substrate and the source and drain regions, and/or providing a graded buffer between the source and drain regions and the boron doped germanium layer. In another example case, the boron doped germanium layer has a graded concentration of at least one of germanium and boron (which may be used with or without graded buffers). This method may be employed, for example, in the fabrication of any electronic devices such as a computing device.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. An integrated circuit structure, comprising:
   a fin comprising silicon;
   a gate electrode over the fin;
   a first source or drain region in the fin proximate a first side of the gate electrode, the first source or drain region comprising two or more facets and a top surface, wherein the first source or drain region comprises silicon and germanium having a germanium concentration graded to a concentration in excess of 50%;
   a first germanide layer over the top surface of the first source or drain region, the first germanide layer comprising silicon, germanium and titanium;
   a second source or drain region in the fin proximate a second side of the gate electrode opposite the first side, the second source or drain region comprising two or more facets and a top surface, wherein the second source or drain region comprises silicon and germanium having a germanium concentration graded to a concentration in excess of 50%; and
   a second germanide layer over the top surface of the second source or drain region, the second germanide layer comprising silicon, germanium and titanium.

2. The integrated circuit structure of claim 1, wherein the first and second source or drain regions have a boron concentration greater than 1E20.

3. The integrated circuit structure of claim 1, wherein the first and second source or drain regions have a boron concentration graded from a base level to a concentration in excess of 1E20.

4. The integrated circuit structure of claim 1, wherein the fin comprises a strained channel between the first and second source or drain regions.

5. The integrated circuit structure of claim 1, wherein the first and second source or drain regions are P-type.

6. An integrated circuit structure, comprising:
   a body comprising silicon;
   a gate electrode over the body;
   a first source or drain region in the body proximate a first side of the gate electrode, the first source or drain region comprising two or more facets and a top surface, wherein the first source or drain region comprises silicon and germanium having a germanium concentration graded to a concentration in excess of 50%;
a first germanide layer over the top surface of the first source or drain region, the first germanide layer comprising silicon, germanium and titanium;
a second source or drain region in the body proximate a second side of the gate electrode opposite the first side, the second source or drain region comprising two or more facets and a top surface, wherein the second source or drain region comprises silicon and germanium having a germanium concentration graded to a concentration in excess of 50%; and
a second germanide layer over the top surface of the second source or drain region, the second germanide layer comprising silicon, germanium and titanium.

7. The integrated circuit structure of claim 6, wherein the first and second source or drain regions have a boron concentration greater than 1E20.

8. The integrated circuit structure of claim 6, wherein the first and second source or drain regions have a boron concentration graded from a base level to a concentration in excess of 1E20.

9. The integrated circuit structure of claim 6, wherein the body comprises a strained channel between the first and second source or drain regions.

10. The integrated circuit structure of claim 6, wherein the first and second source or drain regions are P-type.

11. A computing device, comprising:
a board; and
a component coupled to the board, the component including an integrated circuit structure, comprising:
a fin comprising silicon;
a gate electrode over the fin;
a first source or drain region in the fin proximate a first side of the gate electrode, the first source or drain region comprising two or more facets and a top surface, wherein the first source or drain region comprises silicon and germanium having a germanium concentration graded to a concentration in excess of 50%;
a first germanide layer over the top surface of the first source or drain region, the first germanide layer comprising silicon, germanium and titanium;
a second source or drain region in the fin proximate a second side of the gate electrode opposite the first side, the second source or drain region comprising two or more facets and a top surface, wherein the second source or drain region comprises silicon and germanium having a germanium concentration graded to a concentration in excess of 50%; and
a second germanide layer over the top surface of the second source or drain region, the second germanide layer comprising silicon, germanium and titanium.

12. The computing device of claim 11, further comprising:
a memory coupled to the board.

13. The computing device of claim 11, further comprising:
a communication chip coupled to the board.

14. The computing device of claim 11, further comprising:
a camera coupled to the board.

15. The computing device of claim 11, further comprising:
a global positioning system coupled to the board.

16. The computing device of claim 11, further comprising:
a battery coupled to the board.

17. The computing device of claim 11, further comprising:
an antenna coupled to the board.

18. The computing device of claim 11, wherein the component is a packaged integrated circuit die.

19. The computing device of claim 11, wherein the component is selected from the group consisting of a processor, a communications chip, and a digital signal processor.

20. The computing device of claim 11, wherein the computing device is selected from the group consisting of a mobile phone, a laptop, a desk top computer, a server, and a set-top box.

* * * * *